Nov. 24, 1970 R. W. JONES 3,543,220

INTEGRATED CIRCUIT PIN-SOCKET RECEPTACLE ASSEMBLIES

Filed June 28, 1968

ROBERT W. JONES
INVENTOR.

BY Norman L. Chalfin
AGENT.

United States Patent Office 3,543,220
Patented Nov. 24, 1970

3,543,220
INTEGRATED CIRCUIT PIN-SOCKET RECEPTACLE ASSEMBLIES

Robert W. Jones, 15843 Kalisher, Granada Hills, Calif. 91344

Filed June 28, 1968, Ser. No. 740,883
Int. Cl. H01r *13/54*
U.S. Cl. 339—91 5 Claims

ABSTRACT OF THE DISCLOSURE

This invention relates to novel pin-socket assemblies for integrated circuit devices. The socket assemblies include a plurality of split cylinder devices in a socket base each device having solder terminal extensions preformed to be held in guides in the socket base and to extend therefrom so as to be insertable in a printed circuit assembly and soldered to the leads thereof. The split ends of the cylinder are cantilevered to come together for biting contacts with the pin leads of integrated circuit devices inserted therein. The particular novelty of the assembly in addition to its novel configuration of its pin-socket elements lies in the ease of assembly of the pin sockets and socket base components into an integrated circuit device socket receptacle.

BACKGROUND OF THE INVENTION

The small electronic devices, transistors and integrated circuits in current use are assembled in a flanged cylindrical container known in the art as a TO–5 enclosure. Such TO–5 housings include connecting leads extending from the bottom surface of the housing which resembles a top hat. In the normal use of the devices in TO–5 housings the semi-conductor device leads are inserted in printed circuit boards and soldered to the connecting leads thereof. To remove the semi-conductor device the leads must be unsoldered for removal and resoldered for replacement. Sockets for such TO–5 and similar containers have been provided in the past but they have not been very reliable and suffer from a lack of secure contact capability, not holding the leads very well, and similar problems. A particular difficulty of the prior art socket devices has been their inability to withstand shock or vibration.

In an earlier patent, No. 3,292,138 issued Dec. 13, 1966 to the present inventor jointly with Blanchette and Groves entitled "Circuit Connectors Providing Improved Electrical Contact and Mechanical Retention" pin socket devices were described which had many features to overcome some of the problems described above. The pin sockets described in the above-mentioned patent necessitate a number of operations in their manufacture and in particular require swaging upsetting and rolling of metal parts of the pin socket in assembly of the pin socket to printed circuit boards.

In my co-pending application filed concurrently with this application entitled "Pin Sockets for Electronic Circuit Devices" there was described and claimed pin-socket devices having two post configurations which interfit for assembly directly to printed circuit boards. In the latter application one of the interfitting parts bears a resemblance to a portion of the pin socket element described herein below but differs particularly in that it is not capable of independent assembly and replacement in socket assemblies as is the device of the present invention.

DESCRIPTION OF THE INVENTION

In the present invention an embodiment employing the new elements is described including a socket base with a plurality of pin socket units assembled therein. A twelve pin integrated circuit device may be inserted in the socket. However, the circular arrangement of the present devices may be made different in number where fewer or more pins are involved in the integrated circuit device. Should a rectilinear rather than circular array of contact pins be used in the integrated circuit unit the array of apertures to receive pin socket elements may be in line in two rows or for that matter in any other configuration.

A raised resilient rim on said socket assembly includes a doubly tapered undercut such that the flange of integrated circuit devices inserted therein may be clamped in place, the rim includes a tab guide receiving notch for the correct positioning of the TO–5 cased integrated circuit devices.

The pin socket of the new assembly consists of a split cylinder in which the top of the split portions come together forming a conical type of crimp providing cantilever spring action against any pin inserted between the two portions so sprung together. The action produces a tight bite on the inserted pin.

From the bottom of the split cylinder extends a terminal lead which may be preformed so as to fit in one of an array of guide grooves extending from the socket holes designed to receive the split cylinder pin socket element.

A separable retainer plate holds the pin socket elements in place and also permits easy insertion or removal of the pin socket components in the socket assembly.

Accordingly, the object of this invention is to provide an improved integrated socket assembly and easily inserted and removed pin socket components therefor.

It is another object of this invention to provide integrated circuit socket assemblies with better contact receptacles therein.

These and other objects of the invention will be more fully understood from the specification which follows taken together with the drawing and the appended claims.

While the drawings illustrate a preferred embodiment of the invention, the invention should not be construed as limited thereto since those skilled in the arts appertaining to the invention will be able to devise other embodiments in the light of the teachings herein within the ambit of the claims.

IN THE FIGURES

SPECIFICATION

Figure 1:
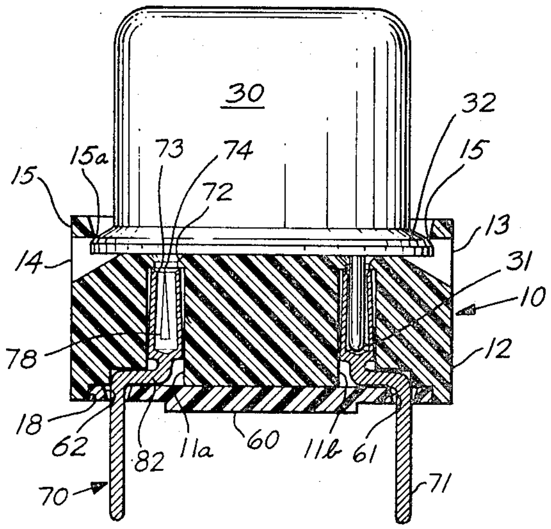
FIG. 1 is a cross sectional view through 1—1 (shown in FIG. 3) of an integrated circuit socket showing part of the pins of an integrated circuit device inserted therein, the pin sockets thereof, and details of the novel features of the socket.

In FIG. 1 there is shown a cross-sectional view of the integrated circuit socket 10 according to this invention. The section was taken through 1—1 of the plan view shown in FIG. 3.

In the cross section of FIG. 1 can be seen a typical bore of which there are many in the base 12, a cutaway 13, 14 in diametrically opposite sides of base 12 and the rim 15 with a doubly tapered undercut 15*a* which is a feature of the invention and further described below. By "doubly-tapered" is meant one which advances inwardly from top to center and outwardly from center to bottom of the rim 15 as more clearly shown in FIG. 1.

Figure 3:
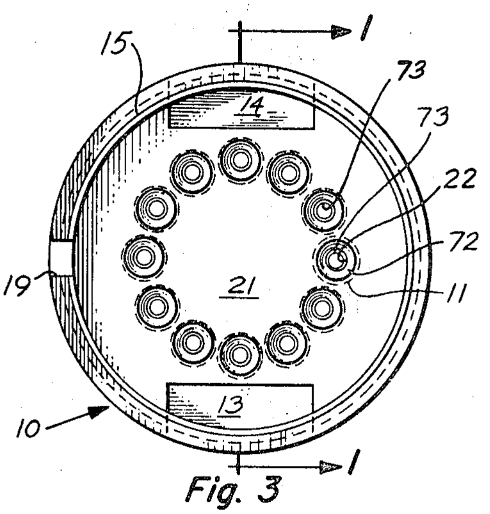
FIG. 3 is a top plan view of the socket, the pins socket terminals thereof not showing.

A pair of pin terminals 70 (shown in detail in FIGS. 7, 8 and 9) are inserted in the bores 11 to illustrate how a typical installation is made. in FIG. 3 a twelve pin socket is illustrated, but any number of pins may be arranged for the socket arrayed on a circular path therearound. A keying notch 19 is provided in 15 to permit exact positioning of a device such as 30 in the socket. The array may also be in-line in 2 rows of 7 or any other necessary configuration.

Figure 2:
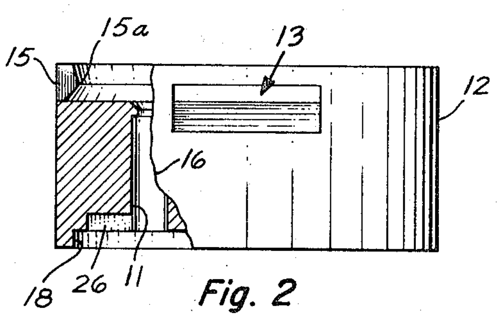
FIG. 2 is a partially cutaway side elevational view of the socket illustrated in FIG. 1.

In FIG. 2 in the side elevational view a cutaway portion 16 reveals the interior details in somewhat the same fashion as in FIG. 1 but without the insertion of the pin sockets 70.

Figure 6:
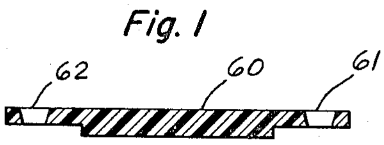
FIG. 6 is a cross section through 6—6 of the plate shown in FIG. 5.
Figure 5:
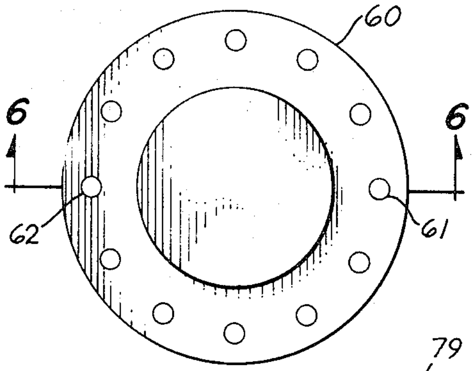
FIG. 5 is a bottom assembly holding plate for the socket.

The bottom of the assembly base 12 is undercut as at 18 to receive the bottom cover plate 60 shown in FIG. 5 and 6. The cover plate includes a plurality of apertures such as 61, 62 which fit over the pin terminal extensions 71 to hold the pins 70 in place. Plate 60 fits snugly in undercut 19 and is bonded in place.

Figure 4:
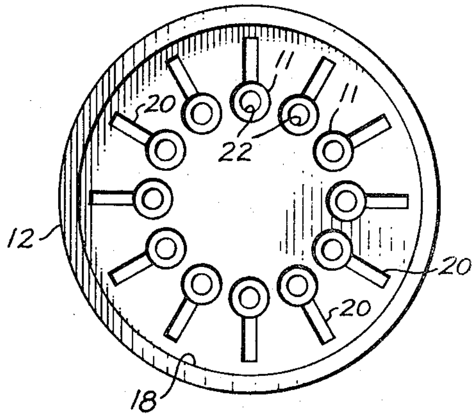
FIG. 4 is a bottom plan view of the socket, with the pin sockets removed.

In the bottom view of base 12 shown in FIG. 4 the plate 60 is removed and the pin inserts 70 are not inserted so that the radial guide grooves 20 may be seen.

Figure 7:
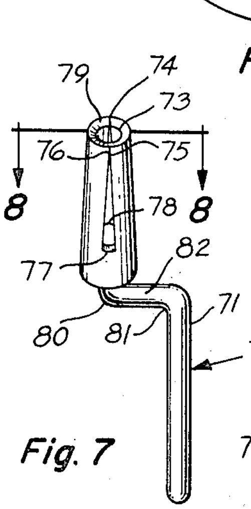
FIG. 7 is a perspective view of a pin socket and terminal as used in the socket assembly of this invention.
Figure 9:
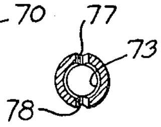
FIG. 9 is a cross section through 9—9 of FIG. 8.
Figure 8:
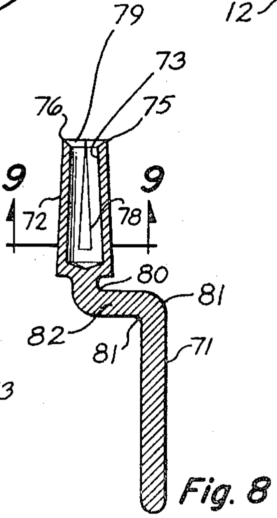
FIG. 8 is a cross section through 8—8 of FIG. 7.

In FIGS. 7–9 the pin socket 70 can be seen to include an upper tapered head 72 with a central bore 73. The tapered head 72 can be described as having a conical crimp. A vertical slot 77, 78 is cut across the diameter of tapered head 72 and bore 73 to a depth nearly the entire length of head 72.

Extending from the bottom of head 72 is a pin extension 71 which is bent at 80 and 81 to form a terminal as further described below for printed circuit board insertion. The horizontal section 82 between bends 80, 81 fits the radial guide groove 20 in the bottom of base 12 so that when the pin socket assembly 70 is inserted in the bores 11 provided therefor. After assembly of units 70 into bores 11 the bottom plate 60 shown in FIG. 5 and in cross section in FIG. 6 is placed into the undercut 18 to hold the pin assemblies in place. The apertures 61, 62 fit over the pin extensions 71 on a wider radius than the radius of bores 11 in base 12.

Referring now more particularly to FIGS. 1, 2 and 3 a specially novel feature of the invention, the doubly-tapered undercut 15*a*, is shown in the rim 15 in the inner periphery of the rim 15 about the top 21 of the base 12. The double-taper forms a lip. It should be noted that the top surface 21 of the base 12 is lower than rim 15. When an integrated circuit device such as shown at 30 is inserted in the pin receptacle. The guide tab thereof (not shown) is aligned with notch 19 and the pin 31 thereof such as shown in aperture 11*b* (FIG. 1) enters the bore 22 in the top 21 of base 12 and then into the entrance 79 of bore 73 separating the cantilevered ends 75, 76 which bite into pin 31. In the bore 11*a* in FIG. 1 no pin is shown to illustrate the position of the cantilevered ends as at 74 (FIG. 7) pressed together by their normal inward resilient urge.

The doubly-tapered undercut 15*a* previously mentioned snaps over the lower flange 32 of the integrated circuit case assembly 30 to hold it in place. This is due to the fact that the material from which the base 12 and rim 15 are fabricated is a resilient plastic such as teflon or a similar material. As has been noted previously, notch 19 in rim 15 is provided for the positioning guide normally part of devices such as 30.

The integrated circuit case is thus tightly held in place and prevented from being shaken out or vibrated out if used in a vibratory environment.

What is claimed as new is:

1. A socket assembly for integrated circuit devices comprising:

a base having a depressed upper and lower surface, and a rim about each depressed urface;

a plurality of bores arranged in said base and extending therethrough;

radial grooves in the lower surface extending a short distance outward from each bore;

a plurality of pin sockets of predetermined configuration to fit said bores and said radial grooves, and having terminal extensions, said pin sockets being inserted in said bores and said radial grooves from said lower surface; and a cover plate including apertures arranged to match the locations of said terminal extensions when said sockets are inserted in said bores and grooves, and being tightly fittable into the depression in said lower surfaces within said rim thereof so as to hold said sockets in place, said terminal extensions protruding from said cover plate to provide soldered or other electrical connections thereto.

2. In the socket assembly defined in claim 1 a positioning notch in said rim about said upper surface to provide a guide for a positioning tab on an integrated circuit device to be inserted in said socket assembly.

3. The socket assembly defined in claim 1 wherein said pin sockets are each configured to include:

a split bored cylinder having a solid pin extension from said cylinder to form said terminal extensions, said pin extension having a first bend at a right angle to the axis of said split cylinder and a second bend at a right angle to said first bend and extending away from said cylinder but in the same axial direction as said cylinder;

said split cylinder having ends being resiliently urged together to form a conical crimp so as to receive and tightly contact the pins of intergrated circuit devices inserted into said bores in said base from the upper surface thereof.

4. The socket assembly defined in claim 1 wherein the rim about said upper surface of said base is configured by the cold flow characteristic thereof to receive and snap over the flanges of the encasement of the integrated circuit device inserted therein to hold the device in place despite vibration or shock to the socket assembly or equipment in which the socket assembly is installed.

5. In the socket assembly defined in claim 1, said pin sockets having a conical crimp configuration, the cone being formed with its apical direction upward to bite on the pins of devices inserted therein.

References Cited

UNITED STATES PATENTS

| | | | |
|---|---|---|---|
| 1,811,464 | 6/1931 | Geloso | 339—193 |
| 2,803,000 | 8/1957 | Johanson | 339—258 |
| 3,168,366 | 2/1965 | Fuller | 339—220 |
| 3,170,752 | 2/1965 | Van Horssen | 339—217 |
| 3,241,094 | 3/1966 | Harton | 339—61 |

FOREIGN PATENTS 676, 861 8/1952 Great Britain.

MARVIN A. CHAMPION, Primary Examiner

J. H. McGLYNN, Assistant Examiner

U.S. Cl. X.R.

339—193, 207, 217, 258